United States Patent
Li et al.

(10) Patent No.: US 10,944,517 B2
(45) Date of Patent: Mar. 9, 2021

(54) TRANSMISSION OF NEW DATA IN A HYBRID AUTOMATIC REPEAT REQUEST (HARQ) RETRANSMISSION WITH POLAR CODED TRANSMISSIONS

(71) Applicants: Jian Li, Beijing (CN); Changlong Xu, Beijing (CN); Jilei Hou, San Diego, CA (US); Neng Wang, Lund (SE); Chao Wei, Beijing (CN); QUALCOMM Incorporated, San Diego, CA (US)

(72) Inventors: Jian Li, Beijing (CN); Changlong Xu, Beijing (CN); Jilei Hou, San Diego, CA (US); Neng Wang, Lund (SE); Chao Wei, Beijing (CN)

(73) Assignee: Qualcomm Incorporated, San Diego, CA (US)

( * ) Notice: Subject to any disclaimer, the term of this patent is extended or adjusted under 35 U.S.C. 154(b) by 72 days.

(21) Appl. No.: 16/078,480

(22) PCT Filed: Nov. 4, 2016

(86) PCT No.: PCT/CN2016/104589
§ 371 (c)(1),
(2) Date: Aug. 21, 2018

(87) PCT Pub. No.: WO2017/157028
PCT Pub. Date: Sep. 21, 2017

(65) Prior Publication Data
US 2019/0052418 A1 Feb. 14, 2019

(30) Foreign Application Priority Data
Mar. 18, 2016 (WO) ................ PCT/CN2016/076809

(51) Int. Cl.
*H04L 1/18* (2006.01)
*H03M 13/13* (2006.01)
(Continued)

(52) U.S. Cl.
CPC .......... *H04L 1/1896* (2013.01); *H03M 13/13* (2013.01); *H03M 13/2906* (2013.01);
(Continued)

(58) Field of Classification Search
CPC ... H04L 1/1812; H04L 1/1819; H04L 1/1896; H04L 1/0041; H04L 1/203; H04L 1/0057;
(Continued)

(56) References Cited

U.S. PATENT DOCUMENTS

2012/0254682 A1 10/2012 Wan et al.
2013/0343271 A1 12/2013 El-Khamy et al.
(Continued)

FOREIGN PATENT DOCUMENTS

CN 102334358 A 1/2012
CN 103281166 A 9/2013
(Continued)

OTHER PUBLICATIONS

Hong S-N., et al., "Capacity-Achieving Rate-Compatible Polar Codes", North American School of Information Theory, ArXiv:1510.01776v2 [cs.IT], Jan. 27, 2016, pp. 1-11.
(Continued)

*Primary Examiner* — April Y Blair
*Assistant Examiner* — Sazzad Hossain
(74) *Attorney, Agent, or Firm* — Loza & Loza, LLP

(57) ABSTRACT

For communication utilizing polar codes, a hybrid automatic repeat request algorithm utilizing incremental redundancy (HARQ-IR) may provide increased throughput by including new data, not based on an original transmission, in a HARQ retransmission. The number of retransmitted bits and new information bits in each HARQ retransmission may be controlled in order to manage a tradeoff between increased throughput and a decreased block error rate (BLER).

30 Claims, 9 Drawing Sheets

(51) Int. Cl.
  *H03M 13/29* (2006.01)
  *H04L 1/00* (2006.01)
  *H04L 1/20* (2006.01)
  *H03M 13/00* (2006.01)
  *H04W 72/04* (2009.01)

(52) U.S. Cl.
  CPC .......... *H04L 1/0041* (2013.01); *H04L 1/1812* (2013.01); *H04L 1/1819* (2013.01); *H04L 1/203* (2013.01); *H03M 13/6306* (2013.01); *H03M 13/6393* (2013.01); *H04L 1/0057* (2013.01); *H04W 72/0446* (2013.01)

(58) Field of Classification Search
  CPC ......... H03M 13/6306; H03M 13/6393; H03M 13/13; H03M 13/2906; H04W 72/0446
  See application file for complete search history.

(56) References Cited

U.S. PATENT DOCUMENTS

| | | | | |
|---|---|---|---|---|
| 2015/0092886 | A1* | 4/2015 | Ionita | H04L 25/4917 375/298 |
| 2015/0333775 | A1* | 11/2015 | Korb | H03M 13/45 714/780 |
| 2015/0358113 | A1 | 12/2015 | Callard et al. | |
| 2016/0164629 | A1 | 6/2016 | Ahn et al. | |
| 2016/0182187 | A1 | 6/2016 | Kim et al. | |
| 2017/0047947 | A1* | 2/2017 | Hong | H04L 1/0067 |
| 2017/0264394 | A1* | 9/2017 | Shen | H03M 13/27 |

FOREIGN PATENT DOCUMENTS

| KR | 20160086945 | | 7/2016 |
|---|---|---|---|
| WO | 2015123855 | A1 | 8/2015 |
| WO | 2015139316 | A1 | 9/2015 |
| WO | 2015149225 | A1 | 10/2015 |

OTHER PUBLICATIONS

International Search Report and Written Opinion—PCT/CN2016/076809—ISA/EPO—dated Nov. 30, 2016.
International Search Report and Written Opinion—PCT/CN2016/104589—ISA/EPO—dated Feb. 4, 2017.
Li B., et al., "Capacity-Achieving Rateless Polar Codes", Aug. 13, 2015 (Aug. 13, 2015), pp. 1-14, XP055449704, DOI: 10.1109/ISIT.2016.7541258, Retrieved from the Internet: URL: https://anciv.org/pdf/1508.03112.pdf. [retrieved on Feb. 9, 2018], Section 1, 2-4.25.
Supplementary European Search Report—EP16894187—Search Authority—The Hague—dated Oct. 16, 2019.

* cited by examiner

TRANSMISSION OF NEW DATA IN A HYBRID AUTOMATIC REPEAT REQUEST (HARQ) RETRANSMISSION WITH POLAR CODED TRANSMISSIONS

PRIORITY CLAIM

This application is a national stage application filed under 35 U.S.C. 371 of PCT Application No. PCT/CN2016/104589 entitled "Transmission of New Data in a Hybrid Automatic Repeat Request (HARQ) Retransmission with Polar Coded Transmissions" filed on Nov. 4, 2016, which is a continuation of PCT Application No. PCT/CN2016/076809 entitled "TRANSMISSION OF NEW DATA IN A HYBRID AUTOMATIC REPEAT REQUEST (HARQ) RETRANSMISSION WITH POLAR CODED TRANSMISSIONS" filed on Mar. 18, 2016, the entire contents of which are incorporated herein by reference as if fully set forth below in its entirety and for all applicable purposes.

TECHNICAL FIELD

The technology discussed below relates generally to information communication systems, and more particularly, to hybrid automatic repeat request (HARQ) utilizing polar codes in communication systems.

BACKGROUND

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

However, even with a robust error correcting code, channel conditions may vary such that from time to time a bit error rate may exceed that which may be corrected. In such a case, retransmission of all or part of a packet can further insure error-free communication. Hybrid automatic repeat request (HARQ) is one such retransmission scheme utilized in many existing communication networks. HARQ can act as a fall-back mechanism, providing for retransmissions when error correction schemes fail to correct for bit errors.

While error correcting codes and HARQ algorithms continue to rapidly advance the capabilities and potential of communication systems, additional enhancements are desired, particularly for potential deployment of future wireless communication networks beyond LTE.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide for a hybrid automatic repeat request algorithm utilizing incremental redundancy (HARQ-IR) for polar codes. The algorithm may provide increased throughput by including new data, not based on an original transmission, in a HARQ retransmission. The number of retransmitted bits and new information bits in each HARQ retransmission may be controlled in order to manage a tradeoff between increased throughput and a decreased block error rate (BLER).

In one aspect, the disclosure provides a method of wireless communication utilizing hybrid automatic repeat request (HARQ). The method includes generating a first information block including first information bits, encoding the first information block utilizing polar coding to generate a first polar code block, transmitting the first polar code block, and receiving a negative acknowledgment (NACK) or receiving no HARQ feedback in response to the first polar code block. The method further includes generating a second information block for a first HARQ retransmission, in which the second information block includes second information bits and third information bits. The second information bits are contained within the first information bits, and the third information bits include first new information bits different from the first information bits. The method further includes encoding the second information block utilizing polar coding to generate a second polar code block, and transmitting the second polar code block.

Another aspect of the disclosure provides a wireless communication device configured to utilize hybrid automatic repeat request (HARQ). The wireless communication device includes a transceiver, a memory, and a processor communicatively coupled to the transceiver and the memory. The processor is configured to generate a first information block comprising first information bits, encode the first information block utilizing polar coding to generate a first polar code block, transmit the first polar code block, and receive a negative acknowledgment (NACK) or receiving no HARQ feedback in response to the first polar code block. The processor is further configured to generate a second information block for a first HARQ retransmission, in which the second information block includes second information bits and third information bits. The second information bits are contained within the first information bits, and the third information bits include first new information bits different from the first information bits. The processor is further configured to encode the second information block utilizing polar coding to generate a second polar code block, and transmit the second polar code block.

Another aspect of the disclosure provides a wireless communication device configured for utilizing hybrid automatic repeat request (HARQ). The wireless communication device includes means for generating a first information block comprising first information bits, means for encoding the first information block utilizing polar coding to generate a first polar code block, means for transmitting the first polar code block, and means for receiving a negative acknowledgment (NACK) or receiving no HARQ feedback in response to the polar code block. The wireless communication device further includes means for generating a second information block for a first HARQ retransmission, in which the second information block includes second information bits and third information bits. The second information bits are contained within the first information bits, and the third information bits include first new information bits different from the first information bits. The wireless communication device further includes means for encoding the second information block utilizing polar coding to generate a second polar code block, and means for transmitting the second polar code block.

Examples of additional aspects of the disclosure follow. In some aspects of the disclosure, the first information bits include a first subset of information bits and a second subset of information bits, and the second information bits include the second subset of information bits. In an aspect of the disclosure, the method further includes selecting a number of bits in the third information bits in accordance with a target block error rate (BLER).

In some aspects of the disclosure, a sum of a number of bits in the second information bits and a number of bits in the third information bits is equal to a number of bits in the first subset of information bits. In some aspects of the disclosure, the first information block further includes first frozen bits, the second information block further includes second frozen bits, and the number of second frozen bits in the second information block is greater than the number of first frozen bits in the first information block. In some aspects of the disclosure, a sum of a number of bits in the second information bits and a number of bits in the third information bits is equal to a number of bits in the first information bits less the number of bits in the second information bits.

In some aspects of the disclosure, the method further includes generating a third information block for a second HARQ retransmission, where the third information block includes fourth information bits and fifth information bits. The fourth information bits are contained within a first set comprising a first union of the second information bits and the third information bits, and the fifth information bits include second new information bits different from the first information bits and the first new information bits. In some aspects of the disclosure, a sum of a number of bits in the fourth information bits and a number of bits in the fifth information bits is equal to a sum of a number of bits in the second information bits and a number of bits in the third information bits, less the number of bits in the fourth information bits.

In some aspects of the disclosure, the method further includes generating a fourth information block for a third HARQ retransmission, where the fourth information block includes sixth information bits and seventh information bits. The sixth information bits are contained within a second set comprising a second union of the fourth information bits and the fifth information bits, and the seventh information bits include third new information bits different from the first information bits, the first new information bits and the second new information bits. In some aspects of the disclosure, a sum of a number of bits in the sixth information bits and a number of bits in the seventh information bits is equal to a sum of a number of bits in the fourth information bits and a number of bits in the fifth information bits, less the number of bits in the sixth information bits.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
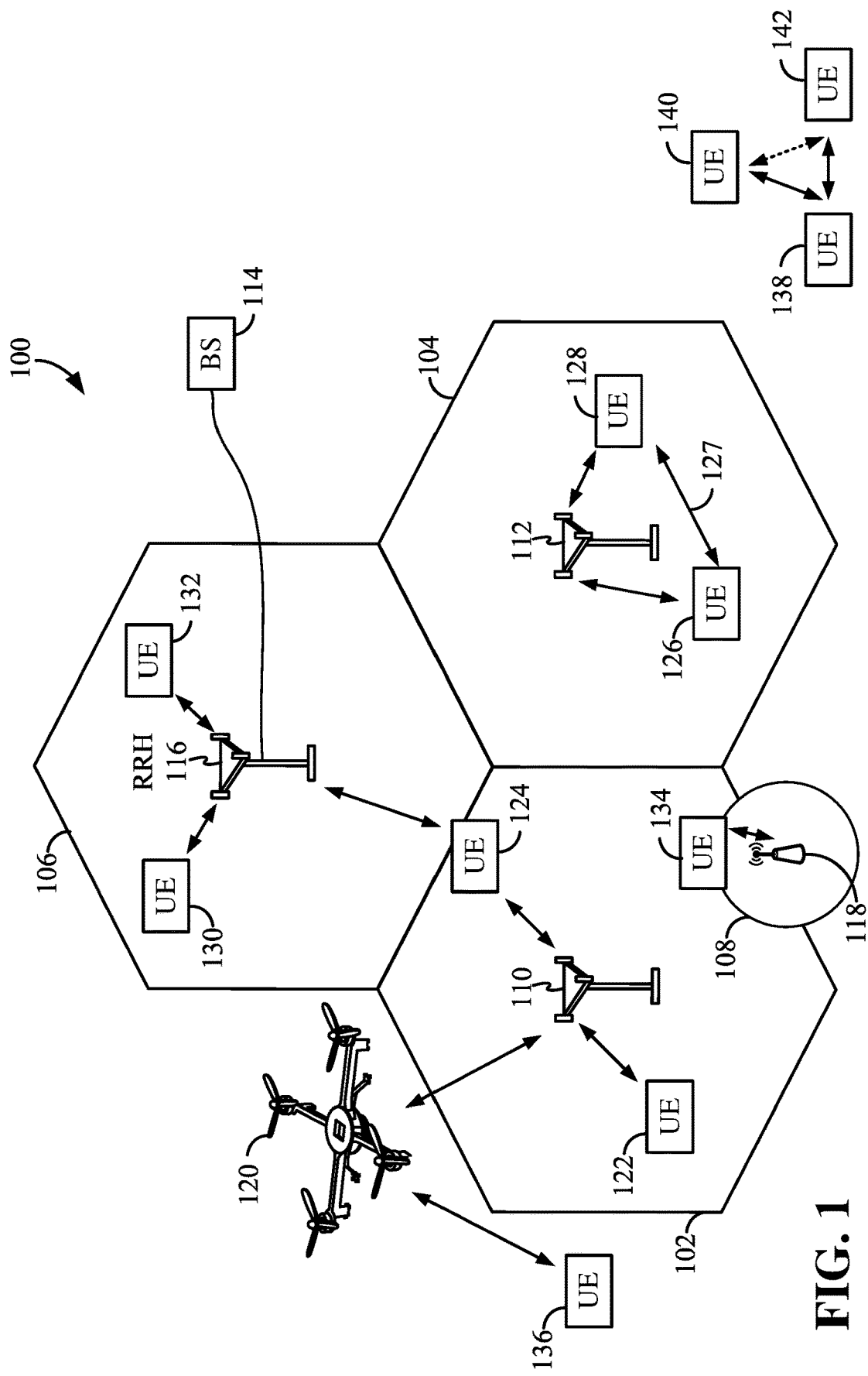
FIG. 1 is a diagram illustrating an example of an access network.

The various concepts presented throughout this disclosure may be implemented across a broad variety of telecommunication systems, network architectures, and communication standards. Referring now to FIG. 1, as an illustrative example without limitation, a simplified schematic illustration of an access network 100 is provided.

The geographic region covered by the access network 100 may be divided into a number of cellular regions (cells), including macrocells 102, 104, and 106, and a small cell 108, each of which may include one or more sectors. Cells may be defined geographically (e.g., by coverage area) and/or may be defined in accordance with a frequency, scrambling code, etc. In a cell that is divided into sectors, the multiple sectors within a cell can be formed by groups of antennas with each antenna responsible for communication with mobile devices in a portion of the cell.

In general, a radio transceiver apparatus serves each cell. A radio transceiver apparatus is commonly referred to as a base station (BS) in many wireless communication systems, but may also be referred to by those skilled in the art as a base transceiver station (BTS), a radio base station, a radio transceiver, a transceiver function, a basic service set (BSS), an extended service set (ESS), an access point (AP), a Node B, an eNode B, or some other suitable terminology.

In FIG. 1, two high-power base stations 110 and 112 are shown in cells 102 and 104; and a third high-power base station 114 is shown controlling a remote radio head (RRH) 116 in cell 106. In this example, the cells 102, 104, and 106 may be referred to as macrocells, as the high-power base stations 110, 112, and 114 support cells having a large size. Further, a low-power base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the low-power base station 118 supports a cell having a relatively small size. Cell sizing can be done according to system design as well as component constraints. It is to be understood that the access network 100 may include any number of wireless base stations and cells. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In some examples, the base stations may be interconnected to one another and/or to one or more other base stations or network nodes (not shown) in the access network 100 through various types of backhaul interfaces such as a direct physical connection, a virtual network, or the like using any suitable transport network.

The access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology.

Within the present document, a "mobile" apparatus need not necessarily have a capability to move, and may be stationary. Some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, and a personal digital assistant (PDA). A mobile apparatus may additionally be an "Internet of things" (IoT) device such as an automotive or other transportation vehicle, a satellite radio, a global positioning system (GPS) device, a logistics controller, a drone, a multi-copter, a quad-copter, a consumer and/or wearable device, such as eyewear, a wearable camera, a smart watch, a health or fitness tracker, a digital audio player (e.g., MP3 player), a camera, a game console, etc. An IoT device may additionally be a digital home or smart home device such as a home audio, video, and/or multimedia device, an appliance, a sensor, a vending machine, intelligent lighting, a home security system, a smart meter, etc. A mobile apparatus may additionally be a smart energy or security device, a solar panel or solar array, municipal lighting, water, or other infrastructure; industrial automation and enterprise device, etc. Still further, a mobile apparatus may provide for telemedicine support, or health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Within the access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with low-power base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quadcopter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or data from a base station (e.g., base station 110) to one or more UEs (e.g., UEs 122 and 124) may be referred to as downlink (DL) transmission, while transmissions of control information and/or data originating at a UE (e.g., UE 122) may be referred to as uplink (UL) transmissions. In addition, the uplink and/or downlink control information and/or data may be transmitted in transmission time intervals (TTIs). As used herein, the term TTI refers to the period in which a block of data, corresponding to the smallest collection of symbols to be processed at the Media Access Control (MAC) layer and above, is transferred by the physical layer onto the radio interface. In accordance with aspects of the present disclosure, a TTI is equal to the duration of a subframe. Thus, as further used herein, the term subframe refers to an encapsulated set of information sent within a single TTI that is capable of being independently decoded. Multiple subframes may be grouped together to form a single frame. Any suitable number of subframes may occupy a frame. In addition, a subframe may have any suitable duration (e.g., 250 µs, 500 µs, 1 ms, etc.).

The air interface in the access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

In some examples, an access network 100 may utilize DL-based mobility or UL-based mobility to enable mobility and handovers from one cell to another. In a network configured for DL-based mobility, during a call with a scheduling entity, or at any other time, a UE may monitor various parameters of the signal from its serving cell as well as various parameters of neighboring cells. Further, depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals may be utilized by the network to select a serving cell for a UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the access network 100. Each of the cells may measure a strength of the pilot signal, and the access network (e.g., one or more of the base stations 110 and 114/116 and/or a central node within the core network) may determine a serving cell for the UE 124. As the UE 124 moves through the access network 100, the network may continue to monitor the uplink pilot signal transmitted by the UE 124. When the signal strength or quality of the pilot signal measured by a neighboring cell exceeds that of the signal strength or quality measured by the serving cell, the network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
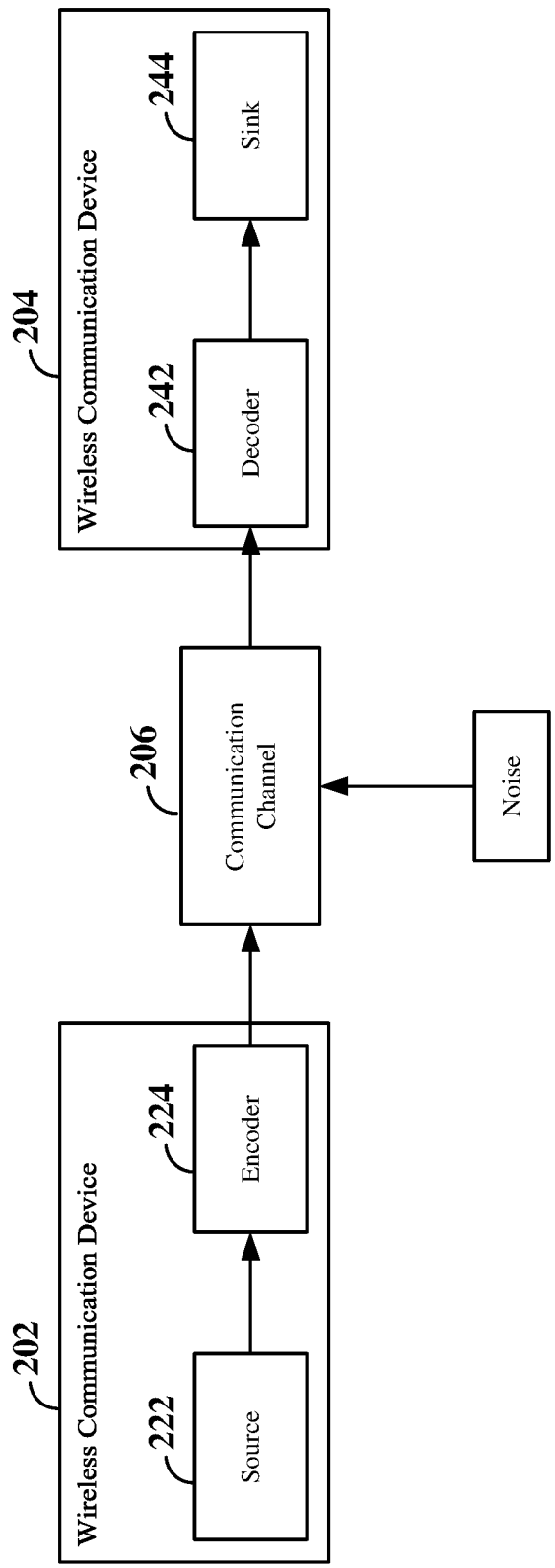
FIG. 2 is a schematic illustration if wireless communication utilizing block codes.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, the first wireless communication device 202 transmits a digital message over a communication channel 206 (e.g., a wireless channel) to the second wireless communication device 204. One issue in such a scheme that must be addressed to provide for reliable communication of the digital message, is to take into account the noise that affects the communication channel 206.

Block codes, or error correcting codes are frequently used to provide reliable transmission of digital messages over such noisy channels. In a typical block code, an information message or sequence is split up into blocks, each block having a length of A bits. An encoder 224 at the first (transmitting) wireless communication device 202 then mathematically adds redundancy to the information message, resulting in a codeword or code block having a length of N, where N>A. Here, the code rate R is the ratio between the message length and the block length: i.e., R=A/N. Exploitation of this redundancy in the encoded information message is a key to reliability of the message, enabling correction for any bit errors that may occur due to the noise. That is, a decoder 242 at the second (receiving) wireless communication device 204 can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to other codes.

Polar codes are linear block error correcting codes invented in 2007 by Erdal Arikan, and currently known to those skilled in the art. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

However, even with the best error correcting codes, if the communication channel 206 experiences a very large amount of noise, or experiences a deep fade or other issue, the bit error rate may exceed what can be compensated. Accordingly, many wireless communication networks utilize a hybrid automatic repeat request (HARQ) scheme to further improve data reliability. In a HARQ algorithm, the transmitting device 202 may retransmit coded information blocks if the first transmission is not decoded correctly at the receiving wireless communication device 204. To facilitate this process, a transmitted code block may include a cyclic redundancy check (CRC) portion, a checksum, or any other suitable mechanism known to those of ordinary skill in the art to determine whether the code block is decoded properly at the receiving device 204. If the received code block is properly decoded, then the receiving device 204 may transmit an acknowledgment (ACK), informing the transmitting device 202 that a retransmission is not needed. However, if the received code block is not properly decoded, then the receiving device 204 may transmit a negative acknowledgment (NACK) requesting a retransmission. In general, a limited number of retransmissions will be made before the transmission attempt is terminated. Many existing networks limit their HARQ algorithms to four retransmissions. However, any suitable retransmission limit may be utilized in a network within the scope of the present disclosure.

Certain aspects of the present disclosure may refer to a particular type or category of HARQ algorithm, referred to herein as incremental redundancy HARQ (HARQ-IR). In HARQ-IR, the retransmitted code block may be different from the originally transmitted code block, and further, if multiple retransmissions are made, each retransmission may differ from one another. Here, retransmissions may include different sets of coded bits: for example, corresponding to different code rates or algorithms; corresponding to different portions of the original information block, some of which may not have been transmitted in the original transmission; corresponding to FEC bits that were not transmitted in the original transmission; or other suitable schemes. The information may then ideally be obtained error-free by virtue of a process called soft combining, where the redundant bits from the retransmission may be combined with the original transmitted bits to increase the probability of correct reception of each bit.

In the related art, a HARQ-IR algorithm has been proposed specifically for use with polar coded transmissions. See Bin Li et al., CAPACITY-ACHIEVING RATELESS POLAR CODES, available at arXiv:1508.03112v1, August 2015. Similar to many conventional HARQ-IR algorithms, the algorithm proposed by Bin Li et al. configures a HARQ retransmission to include a portion of the originally transmitted packet, in order to improve the likelihood that the code block may be successfully decoded at the receiving device. While this algorithm can provide robust and reliable communication, in cases where frequent HARQ retransmissions are needed (e.g., with poor channel conditions), the throughput can suffer. For example, if every packet were retransmitted four times, according to the algorithm proposed by Bin Li et al., throughput would be reduced by 75%.

According to an aspect of the present disclosure, a HARQ process may be modified to increase throughput relative to conventional HARQ processes, even in the face of large numbers of HARQ retransmissions. To achieve higher throughput, a HARQ-IR retransmission may be configured to include new user data, different from the user data included in the first transmitted packet.

Figure 3:
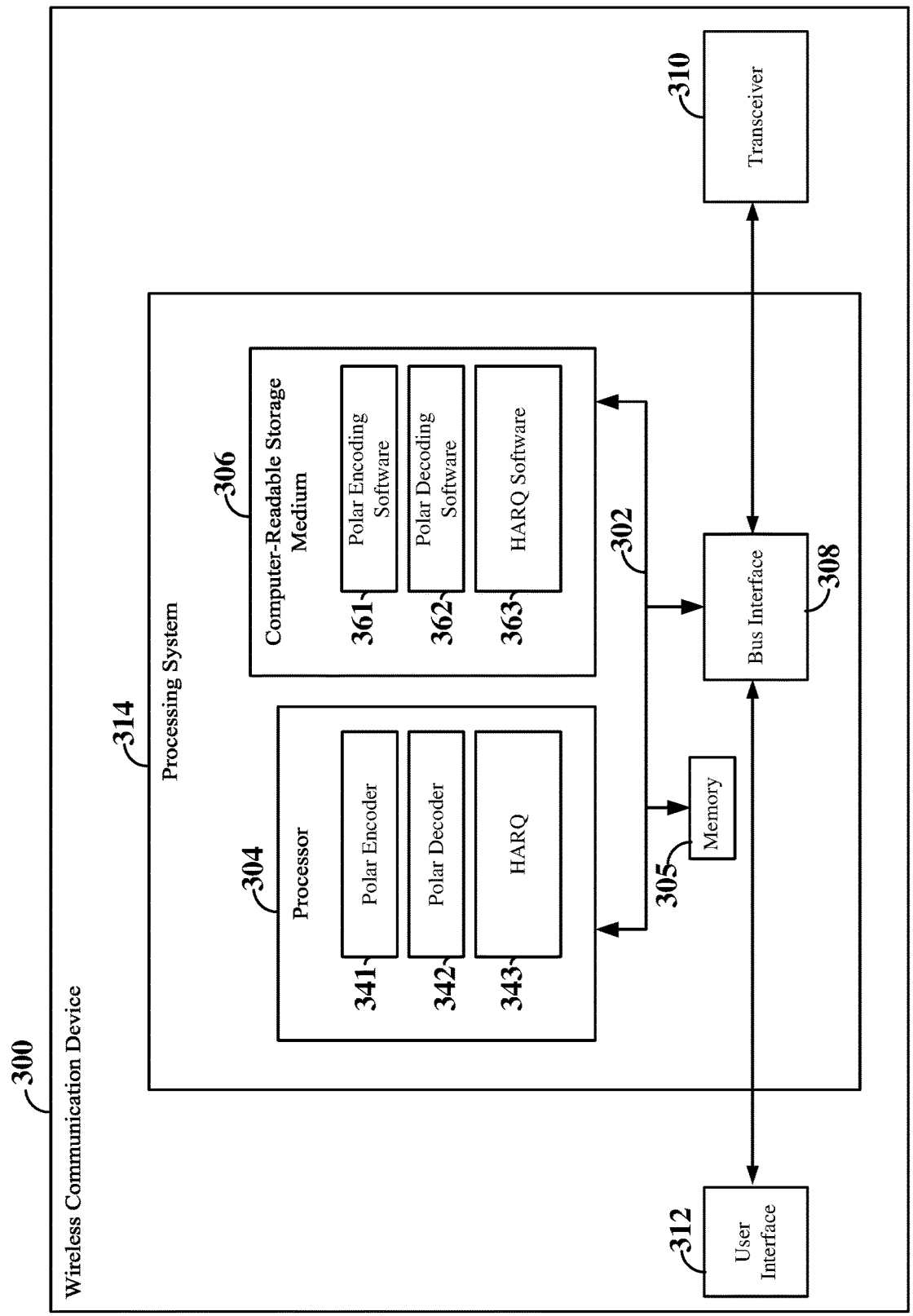
FIG. 3 is a block diagram illustrating an example of a hardware implementation for a wireless communication device employing a processing system according to some embodiments.

FIG. 3 is a block diagram illustrating an example of a hardware implementation for a wireless communication device 300 employing a processing system 314, which may be configured to carry out one or more of the processes and algorithms disclosed herein. That is, in accordance with various aspects of the disclosure, an element, or any portion of an element, or any combination of elements may be implemented with a processing system 314 that includes one or more processors 304. For example, the wireless communication device 300 may be a user equipment (UE), a base station, or any other suitable apparatus or means for wireless communication.

Examples of processors 304 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 304, as utilized in a wireless communication device 300, may be used to implement any one or more of the processes described herein.

In this example, the processing system 314 may be implemented with a bus architecture, represented generally by the bus 302. The bus 302 may include any number of interconnecting buses and bridges depending on the specific application of the processing system 314 and the overall design constraints. The bus 302 links together various circuits including one or more processors (represented generally by the processor 304), a memory 305, and computer-readable media (represented generally by the computer-readable storage medium 306). The bus 302 may also link various other circuits such as timing sources, peripherals, voltage regulators, and power management circuits, which are well known in the art, and therefore, will not be described any further. A bus interface 308 provides an interface between the bus 302 and a transceiver 310. The transceiver 310 provides a means for communicating with various other apparatus over a transmission medium. Depending upon the nature of the apparatus, a user interface 312 (e.g., keypad, display, speaker, microphone, joystick) may also be provided.

The processor 304 is responsible for managing the bus 302 and general processing, including the execution of software stored on the computer-readable medium 306. The software, when executed by the processor 304, causes the processing system 314 to perform the various functions described below for any particular apparatus. The computer-readable medium 306 may also be used for storing data that is manipulated by the processor 304 when executing software.

In some aspects of the disclosure, the processor 304 may include circuitry configured for various functions. For example, the processor 304 may include a polar encoder 341, which may in some examples operate in coordination with polar encoding software 341 stored in the computer-readable storage medium 306. The polar encoder 341 may be configured to polar code an original information block to produce a polar code block having a length of N.

For example, the information block may be represented as an information bit vector $u=(u_1, u_2, \ldots, u_N)$. The polar encoder 341 may polar code the information bit vector to produce the polar code block as an encoded bit vector $c=(c_1, c_2, c_N)$ using a generating matrix $G_N = B_N F^{\otimes n}$, where $B_N$ is the bit-reversal permutation matrix for successive cancellation (SC) decoding (functioning in some ways similar to the interleaver function used by a turbo coder in LTE networks) and $F^{\otimes n}$ is the $n^{th}$ Kronecker power of F. The basic matrix F may be represented as $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. For example, the matrix of $F^{\otimes n}$ may be expressed as:

$$F^{\otimes n} = \begin{bmatrix} 1 & 0 & 0 & & 0 & 0 & 0 & 0 \\ 1 & 1 & 0 & \ldots & 0 & 0 & 0 & 0 \\ 1 & 0 & 1 & & 0 & 0 & 0 & 0 \\ \vdots & & & \ddots & & & & \vdots \\ 1 & 0 & 0 & & 1 & 0 & 0 & 0 \\ 1 & 1 & 0 & & 1 & 1 & 0 & 0 \\ 1 & 0 & 1 & \cdots & 1 & 0 & 1 & 0 \\ 1 & 1 & 1 & & 1 & 1 & 1 & 1 \end{bmatrix}$$

The polar encoder 341 may then generate the polar code block as:

$$c_1^N = u_1^N G_N = u_1^N B_N F^{\otimes n}$$

Thus, the information bit vector u may include a number (N) of original bits that may be polar coded by the generating matrix $G_N$ to produce a corresponding number (N) of coded bits in the polar code block c. In some examples, the information bit vector u may include a number of information bits, denoted K, and a number of frozen bits, denoted Frozen bits are bits that are fixed as 0 or 1. Thus, the value of the frozen bits may generally be known at both the transmitting device and the receiving device. The polar encoder 341 may determine the number of information bits and the number of frozen bits based on the code rate R. For example, the polar encoder 341 may select a code rate R from a set of one or more code rates and select K=N×R bits in the information block to transmit information. The remaining (N−K) bits in the information block may then be fixed as frozen bits F.

In order to determine which information block bits to set as frozen bits, the polar encoder 341 may further analyze the wireless channel over which the polar code block may be sent. For example, the wireless channel for transmitting the polar code block may be divided into a set of sub-channels, such that each encoded bit in the polar code block is transmitted over one of the sub-channels. Thus, each sub-channel may correspond to a particular coded bit location in the polar code block (e.g., sub-channel-1 may correspond to coded bit location containing coded bit $c_1$). The polar encoder 341 may identify the K best sub-channels for transmitting the information bits and determine the original bit locations in the information block contributing to (or corresponding to) the K best sub-channels. For example, based on the generating matrix, one or more of the original bits of the information block may contribute to each of the coded bits of the polar code block. Thus, based on the generating matrix, the polar encoder 341 may determine K original bit locations in the information block corresponding to the K best sub-channels, designate the K original bit locations in the information block for information bits and designate the remaining original bit locations in the information block for fixed bits.

In some examples, the polar encoder 341 may determine the K best sub-channels by performing density evolution or Gaussian approximation. Density evolution is generally known to those skilled in the art, and therefore the details thereof are not described herein. For example, construction of polar codes based on density evolution is described in R. Mori and T. Tanaka PERFORMANCE OF POLAR CODES WITH THE CONSTRUCTION USING DENSITY EVOLUTION, IEEE Commun. Lett., vol. 13, no. 7, pp. 519-521, July 2009. Gaussian approximation is a lower complexity version of density evolution, and is also generally known to those skilled in the art. For example, construction of polar codes based on Gaussian approximation is described in V. Miloslayskaya, SHORTENED POLAR CODES, IEEE Trans. on Information Theory, June 2015.

In general, the polar encoder 341 may perform density evolution or Gaussian approximation to calculate a respective bit error probability (BEP) and/or log likelihood ratio (LLR) for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the polar code block, the LLRs of each of the original bit locations may be derived from the known LLRs of the coded bit locations by performing density evolution or Gaussian approximation. Based on the calculated original bit location LLRs, the polar encoder 341 may sort the sub-channels and select the K best sub-channels (e.g., "good" sub-channels) to transmit the information bits.

The polar encoder 341 may then set the original bit locations of the information block corresponding to the K best sub-channels as including information bits and the remaining original bit locations corresponding to the N−K sub-channels (e.g., "bad" sub-channels) as including frozen bits. Bit-reversal permutation may then be performed by applying the bit-reversal permutation matrix $B_N$ described above to the N bits (including K information bits and N−K frozen bits) to produce a bit-reversed information block. The bit-reversal permutation effectively re-orders the bits of the information block. The bit-reversed information block may then be polar coded by the generating matrix $G_N$ to produce a corresponding number (N) of coded bits in the polar code block. The polar encoder 341 may then transmit the polar code block to a receiving device via the transceiver 310.

Further, the processor 304 may include a polar decoder 342, which may in some examples operate in coordination with polar decoding software 352 stored in the computer-readable medium 306. The polar decoder 342 may be configured to receive a polar code block via the transceiver 310 and decode the polar code block to produce the original information block. In some examples, the polar decoder 342 may perform successive cancellation (SC) polar decoding or SC polar list decoding to decode the polar code block.

For example, the polar decoder 342 may be configured to receive a noisy version of c, and to decode c or, equivalently, u, using a simple successive cancellation (SC) decoding algorithm. Successive cancellation decoding algorithms typically have a decoding complexity of O (N log N) and can achieve Shannon capacity when N is very large. However, for short and moderate block lengths, the error rate performance of polar codes significantly degrades.

Therefore, in some examples, the polar decoder 342 may utilize a SC-list decoding algorithm to improve the polar coding error rate performance With SC-list decoding, instead of only keeping one decoding path (as in simple SC decoders), L decoding paths are maintained, where L>1. At each decoding stage, the polar decoder 342 discards the least probable (worst) decoding paths and keeps only the L best decoding paths. For example, instead of selecting a value u, at each decoding stage, two decoding paths corresponding to either possible value of u, are created and decoding is continued in two parallel decoding threads (2*L). To avoid the exponential growth of the number of decoding paths, at each decoding stage, only the L most likely paths are retained. At the end, the polar decoder 342 will have a list of L candidates for $u_1^N$, out of which the most likely candidate is selected. Thus, when the polar decoder 342 completes the SC-list decoding algorithm, the polar decoder 342 returns a single information block.

Further, the processor 304 may include a HARQ circuit 343, which may in some examples operate in coordination with HARQ software 353. The HARQ circuit 343 may be configured to determine whether decoding of a polar code block has failed (e.g., by receiving a NACK from the receiving device or receiving an indication from the polar decoder 342), and if so, to perform a HARQ algorithm for retransmission of the polar code block. In some examples, the HARQ algorithm is an incremental redundancy HARQ (HARQ-IR), in which the retransmitted polar code block(s) may be different from the originally transmitted polar code block, and further, if multiple retransmissions are made, each retransmission may differ from one another.

In various aspects of the disclosure, rather than the HARQ retransmission being completely based on the information bits in the first transmission, the HARQ algorithm may include new information bits corresponding to new user data in the HARQ retransmission. That is, the HARQ retransmission may include new information bits not previously included in any prior polar code block. By including new information bits in one or more HARQ retransmissions, the throughput may be increased.

In some examples, the wireless communication device 300 may be a transmitting device, which may in some examples correspond to the transmitting device 202 shown in FIG. 2. In this example, the polar encoder 341 may generate a first polar code block utilizing polar coding and transmit the first polar code block to a receiving device, as described above. In response to the transmission of the first polar code block, the wireless communication device 300 (e.g., HARQ circuit 343) may receive an acknowledgement (ACK) or a negative acknowledgement (NACK) from the receiving device via the transceiver 310, or the HARQ circuit 343 may determine that no response has been received from the receiving device within a predetermined receive window or upon expiry of a receive timer. An ACK may be received, for example, if the first polar code block is properly decoded at the receiving device. A NACK may be received, for example, if the first polar code block is not able to be properly decoded at the receiving device.

In some examples, upon receiving a NACK, or upon determining that no response has been received from the receiving device, the HARQ circuit 343 may provide an indication or instruction to the polar encoder 341 that HARQ-IR with new information bits should be utilized for a HARQ retransmission of the first polar code block. Upon receiving the instruction from the HARQ circuit 343, the polar encoder 341 may generate a second polar code block that includes retransmitted information bits selected from the first (original) information block and new information bits corresponding to new user data.

For example, the polar encoder 341 may generate a second information block for the HARQ retransmission that includes a portion of the information bits contained within the first information block and new information bits that are different from the information bits contained within the first information block. In some examples, the information bits in the first information block may be divided into a first subset of information bits and a second subset of information bits. The polar encoder 341 may then select one of the first subset of information bits or the second subset of information bits as the retransmitted information bits in the second information block.

In some examples, the information bits in the first information block may be grouped into the first and second subsets of information bits in accordance with the calculated original bit location LLRs. For example, as described above, the polar encoder 341 may sort the sub-channels based on the original bit location LLRs of the first information block, and select the K best sub-channels (e.g., "good" sub-channels) to transmit the information bits in the first information block. The polar encoder 341 may then set the original bit locations of the first information block corresponding to the K best sub-channels as including information bits and the remaining original bit locations corresponding to the N–K sub-channels (e.g., "bad" sub-channels) as including frozen bits in the first information block. The polar encoder 341 may then select the M best sub-channels from the K best sub-channels in accordance with the original bit location LLRs, group the information bits corresponding to the M best sub-channels (e.g., "best" sub-channels) into a first subset of information bits and the information bits corresponding to the K–M sub-channels (e.g., "worst" sub-channels) into a second subset of information bits.

The polar encoder 341 may then select one of the first subset or the second subset for inclusion in the second information block. In some examples, the polar encoder 341 may select the second subset containing the information bits corresponding to the worst sub-channels for retransmission and populate the bit locations with the highest LLRs in the second information block with the information bits from the second subset to improve the likelihood of the information bits in the second subset being properly decoded at the receiver.

In other examples, the subset of information bits for inclusion in the second information block may be selected from any of the information bits in the first information block, which may or may not be based on the original bit location LLRs of the first information block. For example, the polar encoder 341 may randomly select the subset of information bits for inclusion in the second information block or the polar encoder 341 may utilize any other type of selection algorithm for selecting the subset of information bits.

The polar encoder 341 may further select new information bits corresponding to new user data (e.g., a set of new information bits) for inclusion in the second information block. The new information bits may be selected, for example, from a transmit buffer within the wireless communication device. The polar encoder 341 may then polar code the second information block including the selected subset of information bits for retransmission and the selected set of new information bits to generate the second polar code block.

The total number of information bits included in the second information block may be equal to or less than the total number of information bits included in the first information block. In some examples, if the total number of information bits included in the second information block is less than the total number of information bits included in the first information block, the number of frozen bits included in the second information block is greater than the number of frozen bits in the first information block.

In some examples, the size of the subset of information bits selected for retransmission (e.g., the number of information bits in the selected subset) may be selected to improve the probability that a single retransmission, or a low number of retransmissions, may result in a successful decoding of the first and second polar code blocks. In an aspect of the disclosure, the polar encoder 341 may determine an optimal size of the selected subset in accordance with one or more parameters, such as a target block error rate (BLER) of the HARQ retransmission. For example, the optimal size of the selected subset may maximize the throughput (e.g., maximize the number of new information bits that may be included in the second information block), while still meeting the target BLER requirement for the HARQ retransmission.

In some examples, if the total number of information bits included in the second information block is equal to the number of bits in the non-selected subset in the first information block, the total throughput between the two transmissions (e.g., original transmission and HARQ retransmission) may be maximized. That is, in a polar coded transmission, if the second information block has the same code rate as the effective code rate of the first information block (e.g., the code rate corresponding to the non-selected subset of information bits in the first information block), then the throughput can be maximized. As indicated above, the code rate determines the number of information bits and the number of frozen bits in an information block. For example, the number of information bits K may be determined from the product of the total number of bits N and the code rate R, such that K=N×R. The remaining (N−K) bits in the information block may then be fixed as frozen bits T. Upon successfully decoding the selected subset of retransmitted bits in the second polar code block, the selected subset of retransmitted bits may then be treated as frozen bits in the first polar code block to decode the non-selected subset of information bits. Thus, by setting the total number of information bits in the second information block equal to the number of bits in the non-selected subset of the first information block, the effective code rate of the first information block after the HARQ retransmission may be considered to be equal to the code rate of the second information block.

When the polar encoder 341 is configured to set the total number of information bits in the second information block equal to the number of bits in the non-selected subset of the first information block, the polar encoder 341 may determine the number of new information bits, and thus, the number of bits in the selected subset of information bits from the first information block, that meets the target BLER requirement and maximizes the throughput. In some examples, the polar encoder 341 may vary the size of the set of new information bits and calculate the BLER for each size. Then, from among all sizes of the set of new information bits that meet the target BLER (where the target BLER can be considered an upper threshold), the polar encoder 341 may select the size that provides the maximum throughput (e.g., the size corresponding to the maximum number of new information bits). Once the size of the set of new information bits is known, the size of the selected subset of information bits from the first information block may also be known. For example, the size of the selected subset of information bits may be calculated as half of the difference between the total number of information bits in the first information block and the number of new information bits in the second information block.

If the second polar code block is not decoded correctly at the receiver, the polar encoder 341 may repeat this process by selecting a subset of the information bits included in the second information block for retransmission and including the selected subset of information bits, along with an additional set of new information bits not previously included in the first information block or any prior information block, in a third information block. The subset of information bits included in the third information block may be selected from the set of the union of the retransmitted information bits from the first information block and the new information bits in the second information block. The polar encoder 341 may then polar code the third information block to generate a third polar code block for transmission to the receiving device. This process may be repeated until either the first polar code block is correctly decoded or the first polar code block is considered lost (e.g., no additional retransmissions are available). If no retransmissions are available, the polar encoder 341 may generate a new polar code block utilizing the new information bits included in one or more of the HARQ retransmissions.

In some examples, the wireless communication device 300 may be a receiving device, which may in some examples correspond to the receiving device 204 shown in FIG. 2. In this example, the polar decoder 342 may receive the first polar code block generated using polar coding from the transmitting device via the transceiver 310. The polar decoder 342 may then perform decoding of the first polar code block, as described above. If decoding of the first polar code block fails, the polar decoder 342 may inform the HARQ circuit 343, and the HARQ circuit 343 may in turn generate and transmit a NACK to the transmitting device. In response to the NACK, the polar decoder 342 may receive a second polar code block generated using polar coding from the transmitting device via the transceiver 310.

In accordance with various aspects of the disclosure, the polar decoder 343 may then perform polar decoding of the first and second polar code blocks utilizing HARQ-IR. In some examples, the second polar code block may include a subset of information bits from the first information block, along with new information bits corresponding to new user data. For example, as described above, the first information block may be divided into two subsets of information bits. The second polar code block may then be generated using one of the subsets of information bits from the first information block.

The polar decoder 343 may then perform polar decoding of the first and second polar code blocks by initially attempting to polar decode the second polar code block, including the retransmitted information bits and new information bits. If the second polar code block is successfully decoded, the polar decoder 343 may then set the information bits in the first polar code block corresponding to the retransmitted information bits in the second polar code block as frozen bits in the first polar code block and decode the first polar code block.

If either the first or second polar code block is not successfully decoded, the HARQ circuit 343 may generate and transmit another NACK to the transmitting device to cause the transmitting device to generate and transmit a third polar code block. Upon receiving the third polar code block, the polar decoder 342 may perform polar decoding of the third polar code block, and if successful, set the information bits corresponding to the retransmitted information bits in the third polar code block as frozen bits in the second polar code block and polar decode the information bits in the second polar code block. The polar decoder 343 may then set the information bits corresponding to the retransmitted information bits in the second polar code block as frozen bits in the first polar code block and polar decode the first polar code block. This process may be repeated until either the first polar code block is correctly decoded or the first polar code block is considered lost (e.g., no additional retransmissions are available).

One or more processors 304 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 306. The computer-readable medium 306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 306 may reside in the processing system 314, external to the processing system 314, or distributed across multiple entities including the processing system 314. The computer-readable medium 306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

Figure 4:
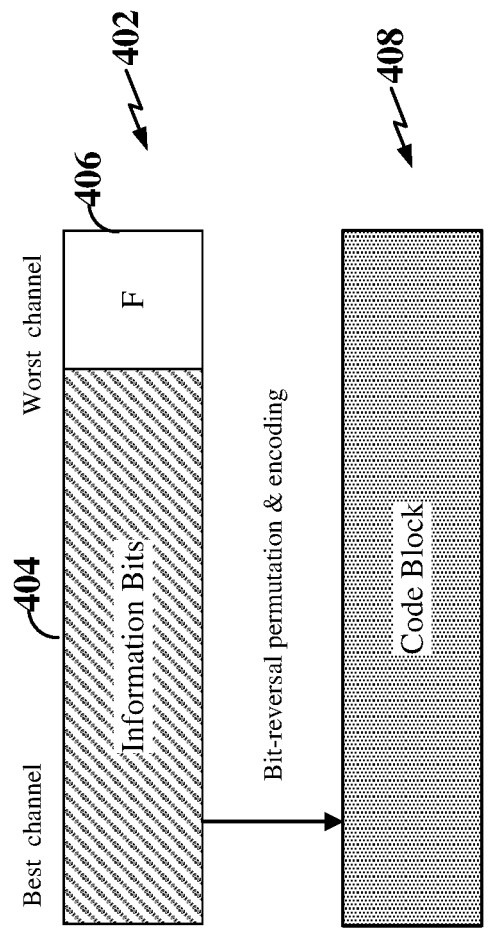
FIG. 4 is a schematic illustration of the generation of a code block utilizing polar coding according to some embodiments.

FIG. 4 is a schematic illustration of a polar coding algorithm as it may be implemented according to some aspects of the disclosure. As illustrated, an information block 402 for polar coding includes a plurality of information bits 404 and a plurality of frozen bits 406. The information block 402 may have a length N, such that the information bits 404 correspond to the K good sub-channels, and the frozen bits 406 correspond to the N–K bad sub-channels, and are thus each fixed with a value of zero. In the example shown in FIG. 4, the information bits 404 are sorted from the best to worst sub-channels. After bit-reversal permutation and encoding in accordance with a polar coding algorithm, a polar code block 408 is obtained. The polar code block 408 may then be transmitted to a receiving device in a first transmission.

Figure 5:
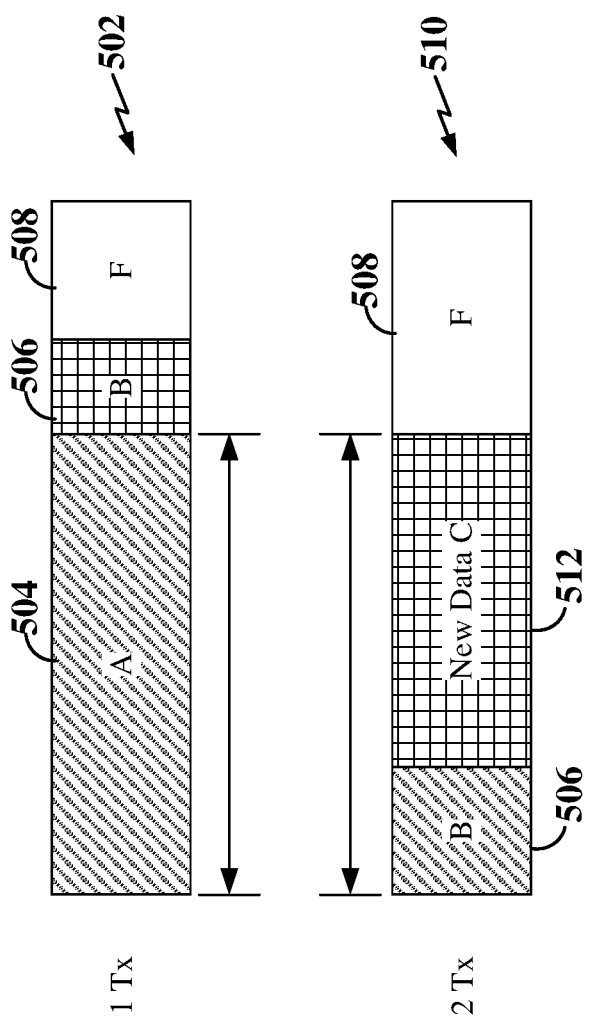
FIG. 5 is a schematic illustration of a two-transmission hybrid automatic repeat request (HARQ) algorithm utilizing incremental redundancy according to some embodiments.

FIG. 5 is a schematic illustration of a two-transmission hybrid automatic repeat request (HARQ) algorithm utilizing incremental redundancy according to some embodiments. In this illustration, only the information bits and frozen bits for each respective information block are shown, although it is to be understood that a bit reversal permutation and encoding process may be implemented for each information block to generate respective polar code blocks for transmission.

As illustrated in FIG. 5, in a first information block 502, the information bits are grouped into two subsets of information bits 504 and 506, denoted A and B. The first information block 502 further includes frozen bits 508 (labeled F). In some examples, the two subsets of information bits 504 and 506 are grouped such that the information bits in the A subset 504 may correspond to the M best sub-channels, whereas the information bits in the B subset 506 may correspond to the K–M worst sub-channels.

After bit-reversal permutation and polar coding of the information block 502 to obtain a first polar code block, the first polar code block may be transmitted to a receiving device in a first transmission (1 Tx). It may then be assumed in this case that the transmitting device receives a NACK (or does not receive HARQ feedback) from the receiving device. Accordingly, the transmitting device may generate a second information block 510 for a HARQ retransmission (2 Tx).

The second information block 510 includes the B subset of information bits 506, which are the same as the B subset of information bits 506 from the first transmission (1 Tx), providing incremental redundancy. However, here, the second information block 510 further includes a set of new information bits 512 (labeled C), including a different data set than the data transmitted in the first transmission. In some examples, the B subset of information bits 506 may correspond to the worst sub-channels (e.g., based on the bit location LLRs), as described above. In this example, the B subset of information bits 506 may be populated in the bit locations of the second information block 510 corresponding to the best sub-channels to improve the likelihood of the B subset of information bits 506 being properly decoded at the receiver. The second information block further includes frozen bits 508. In some examples, as shown in FIG. 5, the number of frozen bits 508 in the second information block 510 may be greater than the number of frozen bits 508 in the first information block 502.

By virtue of the inclusion of the set of new information bits 512 in the HARQ retransmission (2 Tx), the throughput of the transmitting device may be increased. That is, rather than the HARQ retransmission being fully based on the information bits in the first transmission, the HARQ retransmission may include new information bits that may be processed at the receiving device separately from the information in the first transmission.

In order to increase or maximize the total throughput utilizing this HARQ retransmission scheme, the size of the set of bits in the B and C subsets 506 and 512 may be controlled. In some examples, for each transmission, the size of the B subset of information bits 506 (the retransmitted portion from the first transmission) may be selected to improve the probability that a single, or a low number of retransmissions may result in a successful decoding of the first transmission at the receiving device. Thus, in an aspect of the disclosure, the transmitting device may determine the optimal size of B (denoted as |B|) and the optimal size of C (denoted as |C|) in accordance with one or more parameters, such as the block error rate (BLER), in order to increase or maximize the throughput of the information bits in the first transmission. Further, when the size of |B| and |C| are known, then the code rate of the second transmission is also known, and accordingly, the BLER in an additive white Gaussian noise (AWGN) channel is also known.

In a further aspect of the disclosure, the size of the new information bits |C| may be configured such that the sum of |B| and |C| is equal to the size of the A subset of information bits 504 (denoted |A|). The illustration in FIG. 5 shows such an example, shown by the arrows. Here, when |A|=|B|+|C|, the total throughput for a 2-transmission HARQ implementation may be maximized That is, in a polar coded transmission, if the second transmission has the same code rate as the effective code rate of the non-selected information bits (e.g., the A subset of information bits 504) in the first transmission, then the throughput can be maximized By making the length of the sum of |B| and |C| equal to the length of |A|, then the same effective code rate may be utilized in the second transmission or retransmission.

In one example, where the target BLER for the second transmission or retransmission is given, the transmitting device may select the size |C| in order to maximize the throughput. That is, the transmitting device may vary the size of C and calculate the BLER for each value of C. Then, from among all values of C that meet the target BLER (where the target BLER can be considered an upper threshold), the transmitting device may select the value of C that would provide the maximum throughput.

To illustrate the 2-transmission case with a particular example, specific numbers will be applied to the example shown in FIG. 5. For example, it may be assumed that in the first transmission, first information bits A include 177 bits, and second information bits B include 15 bits. That is, |A|=177 and |B|=15. Further, there may be 64 frozen bits F in the first transmission. When the first transmission fails, a second transmission or HARQ retransmission may be generated. In this second transmission, the same 15 information bits B may be transmitted, in addition to 162 new information bits C. Note that |A|=|B|+|C|, or 15+162=177.

In this case, the target BLER for the second transmission may be relatively low, e.g., 0.1. Thus, the length of the second information bits |B| may be set to the value of 15 in accordance with this target BLER. In this manner, it can be seen that the throughput can be increased relative to a conventional HARQ scheme where the new information bits C would not be included in the retransmission.

Figure 6:
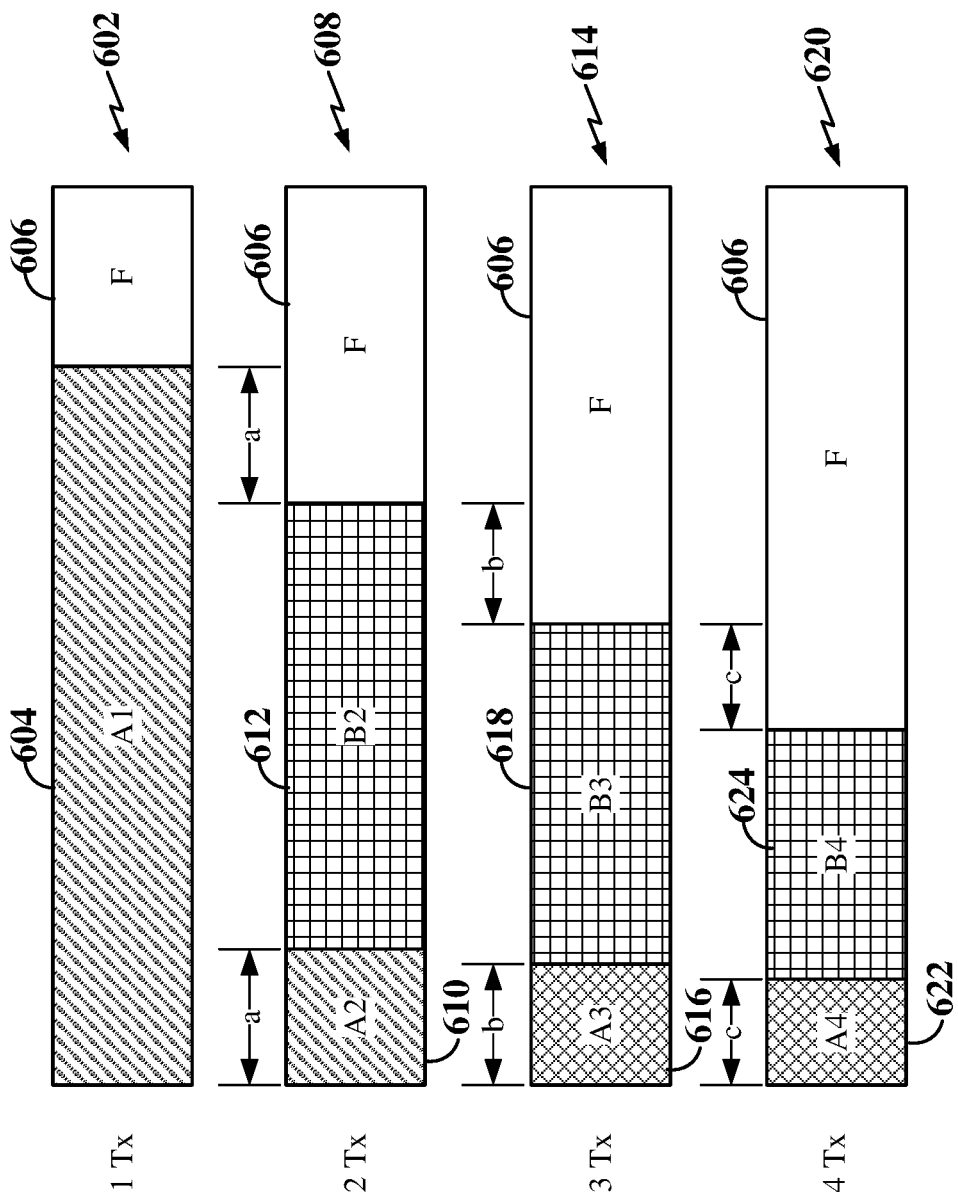
FIG. 6 is a schematic illustration of a four-transmission HARQ algorithm utilizing incremental redundancy according to some embodiments.

FIG. 6 is a schematic illustration of a second example with a HARQ algorithm having four transmissions. That is, as indicated above, in a HARQ process, some implementations may utilize a given maximum number of HARQ retransmissions before terminating transmission attempts corresponding to a given polar code block. In this example, it may be assumed that the transmission would terminate if a NACK or no HARQ feedback is received following transmission of the fourth polar code block, corresponding to the third HARQ retransmission.

In the illustration of FIG. 6, a first information block 602 includes a first set of information bits 604, denoted A1, and frozen bits 606 (labeled F). In the case that the first transmission (1 Tx) is not met with an ACK, the transmitting device may generate a second information block 608 for the second transmission (2 Tx). Here, the second information block 608 includes a second set of information bits 610, denoted A2, which is based on (e.g., a subset of, or contained within) the first set of information bits A1. That is, A2 ⊂ A1. In some examples, the second set of information bits 610 may correspond to the second subset of information bits 506 shown in FIG. 5, and may be selected in accordance with the LLRs of the sub-channels, as described above. In this example, the second set of information bits 610 may be populated in the bit locations of the second information block 614 corresponding to the best sub-channels to improve the likelihood of the second set of information bits 610 being properly decoded at the receiver.

The second information block 608 further includes first new information bits 612, denoted B2, and frozen bits 606 (labeled F). Here, as with the 2-transmission case, the new information bits B2 may be different information than that contained in the first set of information bits A1 (and, accordingly, different information than that contained in the second set of information bits A2). In addition, as shown in FIG. 6, the number of frozen bits 606 in the second information block 608 may be greater than the number of frozen bits 606 in the first information block 602.

In the case that the second transmission is not met with an ACK, the transmitting device may generate a third information block 614 for the third transmission (3 Tx). Here, the third information block 614 includes a third set of information bits 616, denoted A3, which is based on (e.g., a subset of, or contained within) the union of the second set of information bits A2 and the first new information bits B2. That is, A3 ⊂ (A2 ∪ B2). The third information block 614 further includes second new information bits 618, denoted B3, and frozen bits 606 (labeled F). Here, the new information bits B3 may be partially or wholly different information than that contained in the first set of information bits A1 and/or the first new information bits B2. In addition, as shown in FIG. 6, the number of frozen bits 606 in the third information block 614 may be greater than the number of frozen bits 606 in the first information block 602 or the second information block 608.

In the case that the third transmission is not met with an ACK, the transmitting device may generate a fourth information block 620 for the fourth transmission (4 Tx). Here, the fourth information block 620 includes a fourth set of information bits 622, denoted A4, which is based on (e.g., a subset of, or contained within) the union of the third set of information bits A3 and the second new information bits B3. That is, A4 ⊂ (A3 ∪ B3). The fourth information block 620 further includes third new information bits 624, denoted B4, and frozen bits 606 (labeled F). Here, the new information bits B4 may be partially or wholly different information than that contained in the first set of information bits A1, the first new information bits B2 and/or the second new information bits B3. In addition, as shown in FIG. 6, the number of frozen bits 606 in the fourth information block 620 may be greater than the number of frozen bits 606 in any of the previous information blocks 602, 608 and 614.

As with the 2-transmission case described above and illustrated in FIG. 5, transmission of the new information bits B2, B3, and B4 can increase throughput relative to a HARQ scheme that does not include new information bits in HARQ retransmissions. However, in a further aspect of the disclosure, the throughput may be increased or maximized by configuring the length of information bits in each transmission based on the length of information bits in respective previous transmissions.

For example, as illustrated in FIG. 6, the second set of information bits A2 has a length (labeled a) represented by |A2|, and the first new information bits B2 has a length represented by |B2|. In order to increase or maximize the throughput at this retransmission level, the sum of |A2| and |B2| may be configured to be less than |A1|, e.g., by the length of the second set of information bits A2. Specifically, |A2|+|B2|=|A1|−|A2|. With this configuration, to maximize the throughput at this retransmission level, the transmitting device need only determine the optimal size of B2. That is, the transmitting device may vary the size of B2 and calculate the BLER for each value of |B2|. Then, from among all values of |B2| that meets the BLER target, the transmitting device may select the value of |B2| that would provide the maximum throughput.

This scheme may propagate to the remaining transmissions in the same fashion. For example, the third information block 614 may be configured such that the sum of |A3| and |B3| is less than the sum of |A2| and |B2|, e.g., by the length of the third set of information bits A3 (labeled b). Specifically, |A3|+|B3|=|A2|+|B2|−|A3|. With this configuration, to maximize the throughput at this retransmission level, the transmitting device need only determine the optimal size of B3. That is, the transmitting device may vary the size of B3 and calculate the BLER for each value of |B3|. Thus, from among all values of |B3| that meets the BLER target, the transmitting device may select the value of |B3| that would provide the maximum throughput.

Similarly, the fourth information block 620 may be configured such that the sum of |A4| and |B4| is less than the sum of |A3| and |B3|, e.g., by the length of the fourth set of information bits A4 (labeled c). Specifically, |A4|+|B4|=|A3|+|B3|−|A4|. With this configuration, to maximize the throughput at this transmission level, the transmitting device need only determine the optimal size of B4. That is, the transmitting device may vary the size of B4 and calculate the BLER for each value of |B4|. Thus, from among all values of |B4| that meets the BLER target, the transmitting device may select the value of |B4| that would provide the maximum throughput.

While generally, in the above descriptions, targeting maximized throughput has been discussed, this is not the only option within the scope of the present disclosure. Rather, there may be a tradeoff between maximizing throughput and minimizing the BLER. In one particular example, a transmitting device may target to maximize throughput for the second transmission, while targeting to minimize the BLER for subsequent (i.e., the third and fourth) transmissions. In this example, the target BLER for the subsequent transmissions may be minimized, and the optimal size of the set of new information bits may be determined based on the minimized target BLER, as described above.

Figure 7:
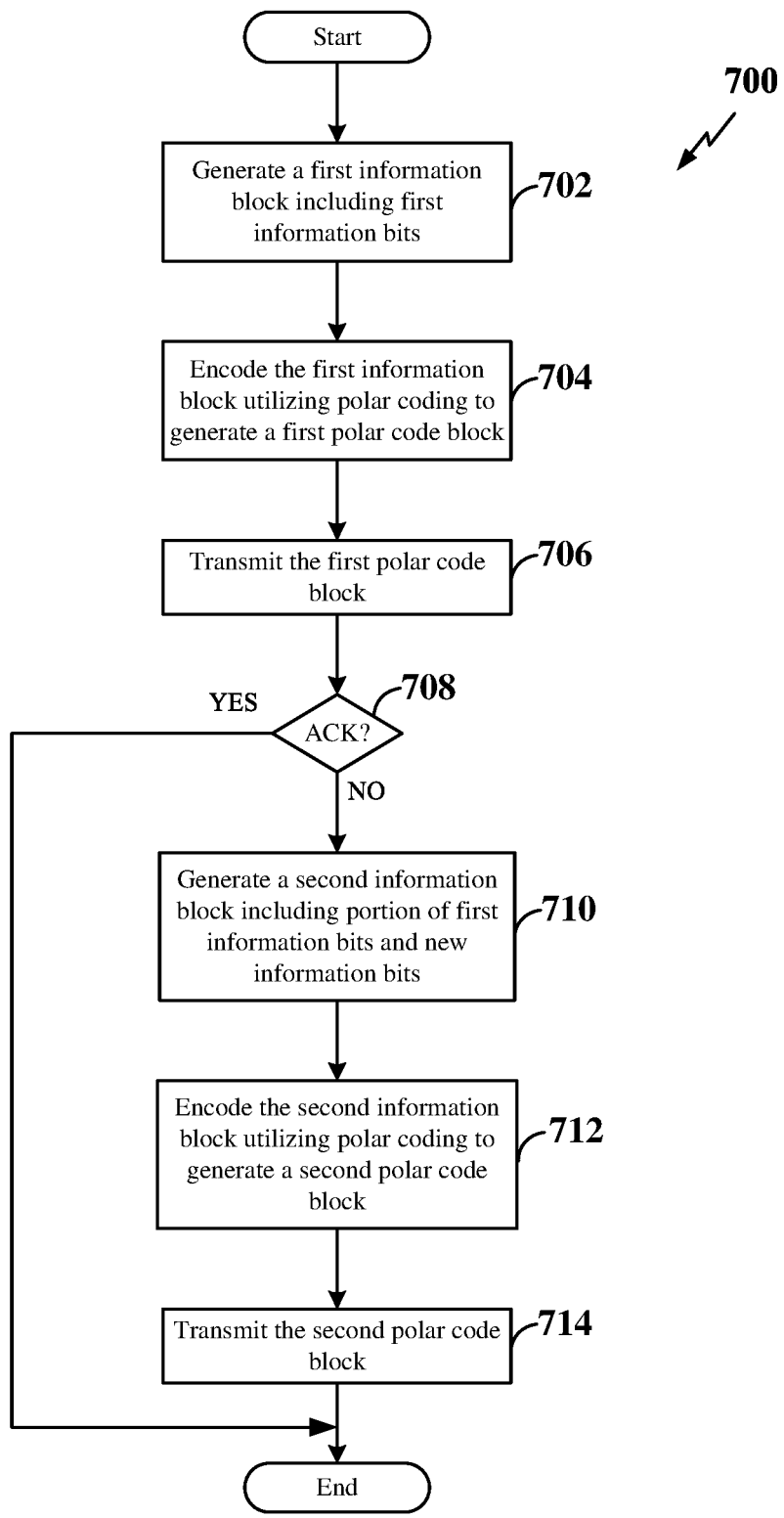
FIG. 7 is a flow chart illustrating an example of a process of wireless communication according to some embodiments.

FIG. 7 is a flow chart illustrating an exemplary process 700 for wireless communication according to some aspects of the present disclosure. In some examples, the process 700 may be implemented by a wireless communication device 202, 204, or 300 as described above and illustrated in FIGS. 2 and 3. In some examples, the process 700 may be implemented by any suitable means for carrying out the described functions.

In various examples, the process 700 may be performed by a transmitting device, e.g., the wireless communication device 202. The process 700 may be implemented when the transmitting device 202 is a user equipment (UE), e.g., for uplink communication; and the process 700 may be implemented when the transmitting device 202 is a base station, e.g., for downlink communication.

At block 702, the wireless communication device may generate a first information block that includes first information bits and frozen bits. For example, the first information bits may correspond to bits A and bits B illustrated in FIG. 5 or bits A1 illustrated in FIG. 6. At block 704, the wireless communication device may encode the first information block utilizing polar coding to generate a first polar code block, and at block 706 the wireless communication device may transmit the first polar code block to a receiving device. For example, the polar encoder 341 in cooperation with the transceiver 310 shown and described above in connection with FIG. 3 may generate and transmit the first polar code block to the receiver.

At block 708, a determination is made whether an ACK is received from the receiving device in response to the first polar code block. If an ACK is received in response to the transmitted first polar code block (Y branch of 708), the process may end. For example, the HARQ circuit 343 shown and described above in connection with FIG. 3 may determine whether an ACK is received.

However, if a NACK or no HARQ feedback is received (N branch of 708), then at block 710, the wireless communication device may generate a second information block for a HARQ retransmission. Here, the second information block includes a portion of the first information bits from the first information block (e.g., corresponding to bits B in FIG. 5 or bits A2 in FIG. 6) and new information bits (e.g., corresponding to bits C in FIG. 5 or bits B2 in FIG. 6). Thus, the retransmitted bits are contained within the first information bits, and the new information bits are different from the first information bits. At block 712, the wireless communication device may encode the second information block utilizing polar coding to generate a second polar code block, and at block 714, the wireless communication device may transmit the second polar code block to the receiver. For example, the polar encoder 341 in cooperation with the transceiver 310 shown and described above in connection with FIG. 3 may generate the second information block, polar code the second information block to generate the second polar code block and transmit the second polar code block to the receiver.

Figure 8:
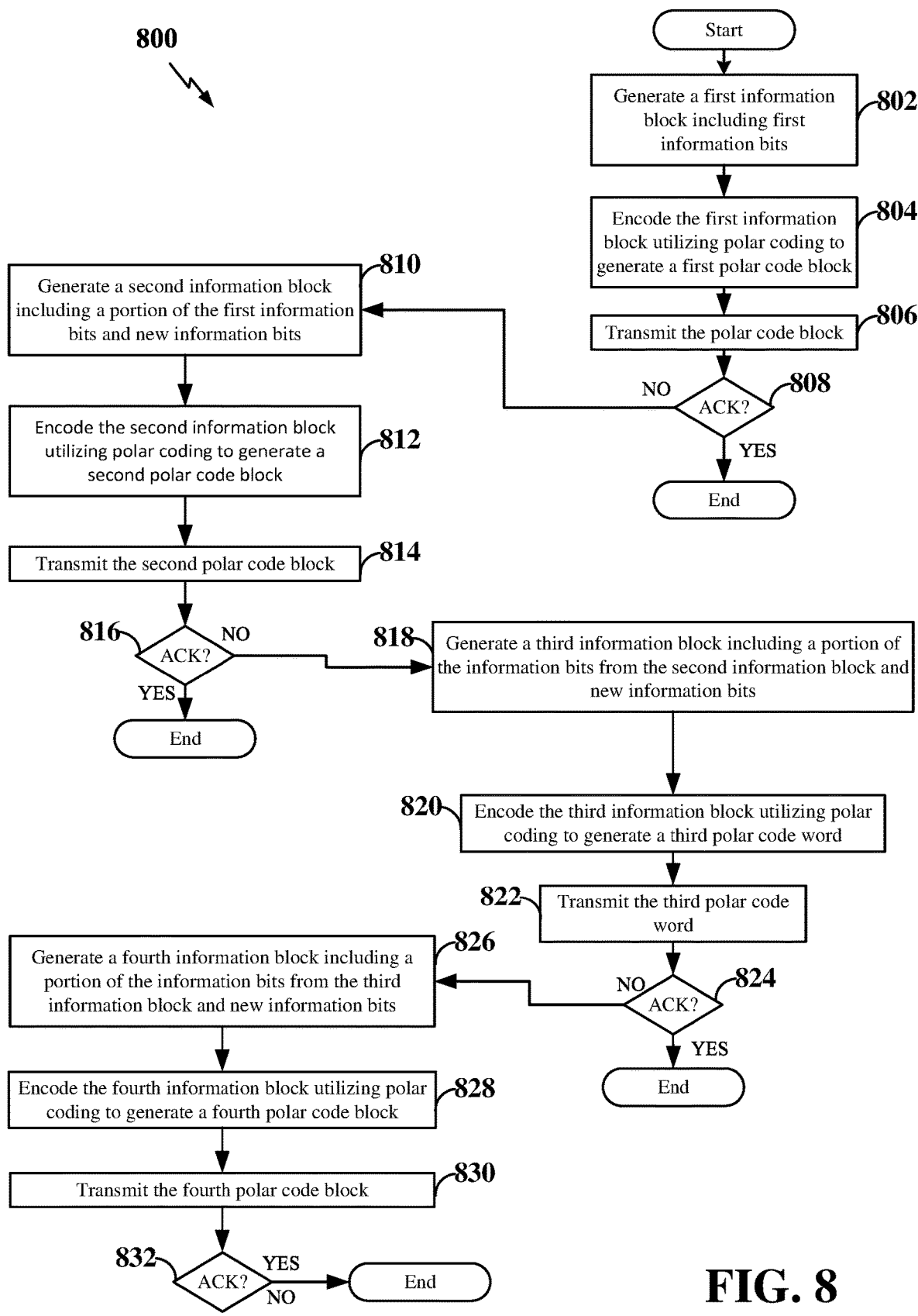
FIG. 8 is a flow chart illustrating an example of a process of wireless communication according to some embodiments.

FIG. 8 is a flow chart illustrating an exemplary process 800 for wireless communication according to some aspects of the present disclosure. In some examples, the process 800 may be implemented by a wireless communication device 202, 204, or 300 as described above and illustrated in FIGS. 2 and 3. In some examples, the process 800 may be implemented by any suitable means for carrying out the described functions.

In various examples, the process 800 may be performed by a transmitting device, e.g., the wireless communication device 202. The process 800 may be implemented when the transmitting device 202 is a user equipment (UE), e.g., for uplink communication; and the process 800 may be implemented when the transmitting device 202 is a base station, e.g., for downlink communication.

At block 802, the wireless communication device may generate a first information block that includes first information bits and frozen bits. For example, the first information bits may correspond to bits A1 illustrated in FIG. 6. At block 804, the wireless communication device may encode the first information block utilizing polar coding to generate a first polar code block, and at block 806 the wireless communication device may transmit the first polar code block to a receiving device. For example, the polar encoder 341 in cooperation with the transceiver 310 shown and described above in connection with FIG. 3 may generate and transmit the first polar code block to the receiver.

At block 808, a determination is made whether an ACK is received from the receiving device in response to the first polar code block. If an ACK is received in response to the transmitted firs polar code block (Y branch of 808), the process may end. For example, the HARQ circuit 343 shown and described above in connection with FIG. 3 may determine whether an ACK is received.

However, if a NACK or no HARQ feedback is received (N branch of 808), then at block 810, the wireless communication device may generate a second information block for a HARQ retransmission. Here, the second information block includes a portion of the first information bits from the first information block (e.g., corresponding to bits A2 in FIG. 6) and new information bits (e.g., corresponding to bits B2 in FIG. 6). Thus, the retransmitted bits are contained within the first information bits, and the new information bits are different from the first information bits. At block 812, the wireless communication device may encode the second information block utilizing polar coding to generate a second polar code block, and at block 814, the wireless communication device may transmit the second polar code block to the receiver. For example, the polar encoder 341 in cooperation with the transceiver 310 shown and described above in connection with FIG. 3 may generate the second information block, polar code the second information block to generate the second polar code block and transmit the second polar code block to the receiver.

At block 816, a determination is made whether an ACK is received from the receiving device in response to the second polar code block. If an ACK is received in response to the transmitted second polar code block (Y branch of 816), the process may end. For example, the HARQ circuit 343 shown and described above in connection with FIG. 3 may determine whether an ACK is received.

However, if a NACK or no HARQ feedback is received (N branch of 816), then at block 818, the wireless communication device may generate a third information block for a second HARQ retransmission. Here, the third information block includes a portion of the information bits from the second information block (e.g., corresponding to bits A3 in FIG. 6) and new information bits (e.g., corresponding to bits B3 in FIG. 6). Thus, the retransmitted bits A3 are contained within a set including a union of bits A2 and bits B2, and the new information bits B3 are different from at least the first information bits. At block 20, the wireless communication device may encode the third information block utilizing polar coding to generate a third polar code block, and at block 822, the wireless communication device may transmit the third polar code block to the receiver. For example, the polar encoder 341 in cooperation with the transceiver 310 shown and described above in connection with FIG. 3 may generate the third information block, polar code the third information block to generate the third polar code block and transmit the third polar code block to the receiver.

At block 824, a determination is made whether an ACK is received from the receiving device in response to the third polar code block. If an ACK is received in response to the transmitted third polar code block (Y branch of 824), the process may end. For example, the HARQ circuit 343 shown and described above in connection with FIG. 3 may determine whether an ACK is received.

However, if a NACK or no HARQ feedback is received (N branch of 824), then at block 826, the wireless communication device may generate a fourth information block for a third HARQ retransmission. Here, the fourth information block includes a portion of the information bits from the third information block (e.g., corresponding to bits A4 in FIG. 6) and new information bits (e.g., corresponding to bits B4 in FIG. 6). Thus, the retransmitted bits A4 are contained within a set including a union of bits A3 and bits B3, and the new information bits B4 are different from at least the first information bits. At block 828, the wireless communication device may encode the fourth information block utilizing polar coding to generate a fourth polar code block, and at block 830, the wireless communication device may transmit the fourth polar code block to the receiver. At block 832, whether or not an ACK is received, the process may end. For example, the polar encoder 341 in cooperation with the transceiver 310 shown and described above in connection with FIG. 3 may generate the fourth information block, polar code the fourth information block to generate the fourth polar code block and transmit the fourth polar code block to the receiver.

Figure 9:
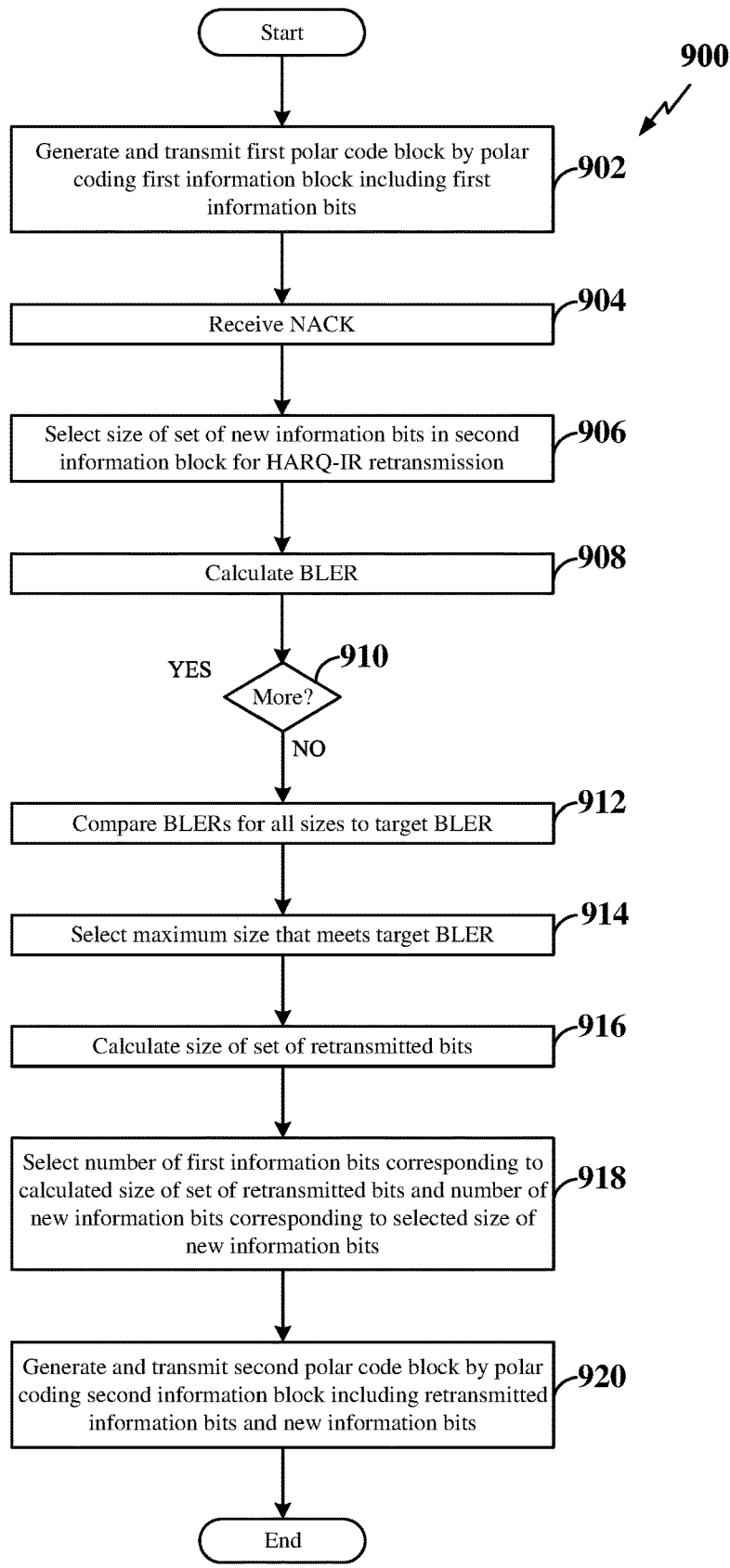
FIG. 9 is a flow chart illustrating an example of a process of HARQ-IR with new user data according to some embodiments.

FIG. 9 is a flow chart illustrating an example of a process 900 of HARQ-IR including new information bits according to some embodiments. In some examples, the process 900 may be implemented by a wireless communication device 202, 204, or 300 as described above and illustrated in FIGS. 2 and 3. In some examples, the process 900 may be implemented by any suitable means for carrying out the described functions.

In various examples, the process 900 may be performed by a transmitting device, e.g., the wireless communication device 202. The process 900 may be implemented when the transmitting device 202 is a user equipment (UE), e.g., for uplink communication; and the process 900 may be implemented when the transmitting device 202 is a base station, e.g., for downlink communication.

At block 902, the wireless communication device may generate a first polar code block by polar coding a first information block that includes first information bits and frozen bits and transmit the first polar code block to a receiving device. For example, the polar encoder 341 in cooperation with the transceiver 310 shown and described above in connection with FIG. 3 may generate and transmit the first polar code block to the receiver. At 904, the wireless communication device may receive a NACK from the receiving device in response to the first polar code block. For example, the HARQ circuit 343 shown and described above in connection with FIG. 3 may determine whether an ACK is received.

At block 906, the wireless communication device may select a size of a set of new information bits to be included in a second information block for a HARQ-IR retransmission. For example, the wireless communication device may select a size that is less than the size of the set of first information bits in the first information block. At block 908, the wireless communication device may calculate the BLER for the HARQ-IR retransmission based on the selected size for the set of new information bits. At block 910, the process returns to block 906, where wireless communication device selects another size for the set of new information bits, and at 908, calculates the BLER for the other size. This process repeats until the BLER has been calculated for each potential new information bit size. For example, the potential new information bit sizes may be selected from a range of potential new information bit sizes less than the size of the set of information bits in the first information block. For example, the HARQ circuit 343 in combination with the polar encoder 341 shown and described above in connection with FIG. 3 may calculate the BLER for each potential size of the set of new information bits for the second information block.

At block 912, the wireless communication device may compare the BLERs calculated for each potential new information bit size to a target BLER for the HARQ-IR retransmission. In some examples, the target BLER may be may be relatively low, e.g., 0.1. In other examples, the target BLER may be set high, e.g., 1e-5, to improve the likelihood of the HARQ retransmission being properly decoded. For example, the HARQ circuit 343 in combination with the polar encoder 341 shown and described above in connection with FIG. 3 may compare the BLER for each potential new information bit size to the target BLER.

At block 914, the wireless communication device may select the size of the set of new information bits that maximizes the throughput and meets the target BLER. For example, the wireless communication device may select the maximum size of the set of new information bits that meets the target BLER. At block 916, the wireless communication device may calculate the size of the set of retransmitted information bits based on the size of the set of new information bits. In some examples, the size of the set of retransmitted information bits may be calculated as half of the difference between the total number of information bits in the first information block and the number of new information bits corresponding to the selected size of the set of new information bits. For example, the HARQ circuit 343 in combination with the polar encoder 341 shown and described above in connection with FIG. 3 may select the size of the set of new information bits and calculate the size of the set of retransmitted bits for the second information block.

At block 918, the wireless communication device may then select a number of first information bits corresponding to the calculated size of the set of retransmitted information bits and a number of new information bits corresponding to the selected size of the set of new information bits for inclusion in a second information block. In some examples, the first information bits within the bit locations in the first information block corresponding to the worst sub-channels may be selected for retransmission. At block 920, the wireless communication device may then generate a second polar code block by polar coding the second information block that includes retransmitted information bits, new information bits and frozen bits and transmit the second polar code block to the receiving device. For example, the polar encoder 341 in combination with the transceiver 310 shown and described above in connection with FIG. 3 may select the retransmitted and new information bits for the second information block, polar code the second information block to generate the second polar code block and transmit the polar code block to the receiver.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-9 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-3 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication utilizing hybrid automatic repeat request (HARQ), the method comprising:
generating a first information block comprising first information bits;
encoding the first information block utilizing polar coding to generate a first polar code block;
transmitting the first polar code block;
receiving a negative acknowledgment (NACK) or receiving no HARQ feedback in response to the first polar code block;
generating a second information block for a first HARQ retransmission, the second information block comprising second information bits and third information bits, wherein the second information bits are contained within the first information bits, and wherein the third information bits comprise first new information bits different from the first information bits such that each first new information bit in a corresponding first bit position of the first new information bits is different from each first information bit in a corresponding second bit position of the first information bits;
encoding the second information block utilizing polar coding to generate a second polar code block; and
transmitting the second polar code block.

2. The method of claim 1, wherein:
the first information bits comprise a first subset of information bits and a second subset of information bits; and
the second information bits comprise the second subset of information bits.

3. The method of claim 2, further comprising:
selecting a number of bits in the third information bits in accordance with a target block error rate (BLER).

4. The method of claim 2, wherein a sum of a number of bits in the second information bits and a number of bits in the third information bits is equal to a number of bits in the first subset of information bits.

5. The method of claim 1, wherein:
the first information block further comprises first frozen bits;
the second information block further comprises second frozen bits; and
the number of second frozen bits in the second information block is greater than the number of first frozen bits in the first information block.

6. The method of claim 1, wherein a sum of a number of bits in the second information bits and a number of bits in the third information bits is equal to a difference between a number of bits in the first information bits and the number of bits in the second information bits.

7. The method of claim 1, further comprising:
generating a third information block for a second HARQ retransmission, the third information block comprising fourth information bits and fifth information bits, wherein the fourth information bits are contained within a first set comprising a first union of the second information bits and the third information bits, and wherein the fifth information bits comprise second new information bits different from the first information bits and the first new information bits.

8. The method of claim 7, wherein a sum of a number of bits in the fourth information bits and a number of bits in the fifth information bits is equal to a difference between a sum of a number of bits in the second information bits and a number of bits in the third information bits and the number of bits in the fourth information bits.

9. The method of claim 7, further comprising:
generating a fourth information block for a third HARQ retransmission, the fourth information block comprising sixth information bits and seventh information bits, wherein the sixth information bits are contained within a second set comprising a second union of the fourth information bits and the fifth information bits, and wherein the seventh information bits comprise third new information bits different from the first information bits, the first new information bits and the second new information bits.

10. The method of claim 9, wherein a sum of a number of bits in the sixth information bits and a number of bits in the seventh information bits is equal to a sum of a number of bits in the fourth information bits and a number of bits in the fifth information bits, less the number of bits in the sixth information bits.

11. A wireless communication device configured to utilize hybrid automatic repeat request (HARQ), the wireless communication device comprising:
a transceiver;
a memory; and
a processor communicatively coupled to the transceiver and the memory, wherein the processor is configured to:
generate a first information block comprising first information bits;
encode the first information block utilizing polar coding to generate a first polar code block;
transmit the first polar code block;
receive a negative acknowledgment (NACK) or receiving no HARQ feedback in response to the first polar code block;
generate a second information block for a first HARQ retransmission, the second information block comprising second information bits and third information bits, wherein the second information bits are contained within the first information bits, and wherein the third information bits comprise first new information bits different from the first information bits such that each first new information bit in a corresponding first bit position of the first new information bits is different from each first information bit in a corresponding second bit position of the first information bits;
encode the second information block utilizing polar coding to generate a second polar code block; and
transmit the second polar code block.

12. The wireless communication device of claim 11, wherein:
the first information bits comprise a first subset of information bits and a second subset of information bits; and
the second information bits comprise the second subset of information bits.

13. The wireless communication device of claim 12, wherein the processor is further configured to:
select a number of bits in the third information bits in accordance with a target block error rate (BLER).

14. The wireless communication device of claim 12, wherein a sum of a number of bits in the second information bits and a number of bits in the third information bits is equal to a number of bits in the first subset of information bits.

15. The wireless communication device of claim 11, wherein:
the first information block further comprises first frozen bits;

the second information block further comprises second frozen bits; and the number of second frozen bits in the second information block is greater than the number of first frozen bits in the first information block.

16. The wireless communication device of claim 11, wherein a sum of a number of bits in the second information bits and a number of bits in the third information bits is equal to a difference between a number of bits in the first information bits and the number of bits in the second information bits.

17. The wireless communication device of claim 11, wherein the processor is further configured to:

generate a third information block for a second HARQ retransmission, the third information block comprising fourth information bits and fifth information bits, wherein the fourth information bits are contained within a first set comprising a first union of the second information bits and the third information bits, and wherein the fifth information bits comprise second new information bits different from the first information bits and the first new information bits.

18. The wireless communication device of claim 17, wherein a sum of a number of bits in the fourth information bits and a number of bits in the fifth information bits is equal to a difference between a sum of a number of bits in the second information bits and a number of bits in the third information bits and the number of bits in the fourth information bits.

19. The wireless communication device of claim 17, wherein the processor is further configured to:

generate a fourth information block for a third HARQ retransmission, the fourth information block comprising sixth information bits and seventh information bits, wherein the sixth information bits are contained within a second set comprising a second union of the fourth information bits and the fifth information bits, and wherein the seventh information bits comprise third new information bits different from the first information bits, the first new information bits and the second new information bits.

20. The wireless communication device of claim 19, wherein a sum of a number of bits in the sixth information bits and a number of bits in the seventh information bits is equal to a sum of a number of bits in the fourth information bits and a number of bits in the fifth information bits, less the number of bits in the sixth information bits.

21. A wireless communication device configured for utilizing hybrid automatic repeat request (HARQ), the wireless communication device comprising:

means for generating a first information block comprising first information bits;

means for encoding the first information block utilizing polar coding to generate a first polar code block;

means for transmitting the first polar code block;

means for receiving a negative acknowledgment (NACK) or receiving no HARQ feedback in response to the polar code block;

means for generating a second information block for a first HARQ retransmission, the second information block comprising second information bits and third information bits, wherein the second information bits are contained within the first information bits, and wherein the third information bits comprise first new information bits different from the first information bits such that each first new information bit in a corresponding first bit position of the first new information bits is different from each first information bit in a corresponding second bit position of the first information bits;

means for encoding the second information block utilizing polar coding to generate a second polar code block; and means for transmitting the second polar code block.

22. The wireless communication device of claim 21, wherein:

the first information bits comprise a first subset of information bits and a second subset of information bits; and the second information bits comprise the second subset of information bits.

23. The wireless communication device of claim 22, further comprising:

means for selecting a number of bits in the third information bits in accordance with a target block error rate (BLER).

24. The wireless communication device of claim 22, wherein a sum of a number of bits in the second information bits and a number of bits in the third information bits is equal to a number of bits in the first subset of information bits.

25. The wireless communication device of claim 21, wherein:

the first information block further comprises first frozen bits;

the second information block further comprises second frozen bits; and the number of second frozen bits in the second information block is greater than the number of first frozen bits in the first information block.

26. The wireless communication device of claim 21, wherein a sum of a number of bits in the second information bits and a number of bits in the third information bits is equal to a difference between a number of bits in the first information bits and the number of bits in the second information bits.

27. The wireless communication device of claim 21, further comprising:

means for generating a third information block for a second HARQ retransmission, the third information block comprising fourth information bits and fifth information bits, wherein the fourth information bits are contained within a first set comprising a first union of the second information bits and the third information bits, and wherein the fifth information bits comprise second new information bits different from the first information bits and the first new information bits.

28. The wireless communication device of claim 27, wherein a sum of a number of bits in the fourth information bits and a number of bits in the fifth information bits is equal to a difference between a sum of a number of bits in the second information bits and a number of bits in the third information bits and the number of bits in the fourth information bits.

29. The wireless communication device of claim 27, further comprising:

means for generating a fourth information block for a third HARQ retransmission, the fourth information block comprising sixth information bits and seventh information bits, wherein the sixth information bits are contained within a second set comprising a second union of the fourth information bits and the fifth information bits, and wherein the seventh information bits comprise third new information bits different from the first information bits, the first new information bits and the second new information bits.

30. The wireless communication device of claim 29, wherein a sum of a number of bits in the sixth information bits and a number of bits in the seventh information bits.

* * * * *